United States Patent [19]
Lee et al.

[11] Patent Number: 5,476,807
[45] Date of Patent: Dec. 19, 1995

[54] METHOD FOR FORMING FINE PATTERNS IN A SEMICONDUCTOR DEVICE

[75] Inventors: Kang-hyun Lee, Seoul; Jong-seo Hong; Hyoung-sub Kim, both of Kyungki-do; Jae-ho Kim, Seoul; Min-seog Han, Kyungki-do, all of Rep. of Korea

[73] Assignee: Samsung Electronics Co., Ltd., Suwon, Rep. of Korea

[21] Appl. No.: 227,534

[22] Filed: Apr. 14, 1994

[30] Foreign Application Priority Data

Apr. 15, 1993 [KR] Rep. of Korea .................. 93-6337

[51] Int. Cl.$^6$ .................................................. H01L 21/00
[52] U.S. Cl. ...................... 437/52; 437/228; 156/643.1; 156/646.1; 156/656.1; 156/661.11; 156/659.11; 156/651.1
[58] Field of Search ....................... 156/643.1, 646.1, 156/656.1, 659.11, 661.11, 657.1; 437/228, 52

[56] References Cited

U.S. PATENT DOCUMENTS

| | | | |
|---|---|---|---|
| 4,432,132 | 2/1984 | Kinsbron et al. | 156/643 X |
| 4,462,882 | 7/1984 | Horwitz | 156/643 X |
| 4,874,723 | 10/1989 | Jucha et al. | 156/643 X |
| 5,106,774 | 4/1992 | Hieda et al. | 437/228 X |
| 5,116,460 | 5/1992 | Bukhman | 156/643 |
| 5,183,533 | 2/1993 | Tsutsumi et al. | 156/659.1 X |
| 5,266,157 | 11/1993 | Kadomura | 156/659.1 |
| 5,296,095 | 3/1994 | Nabeshima et al. | 156/643 X |
| 5,310,454 | 5/1994 | Ohiwa et al. | 156/643 |
| 5,342,481 | 8/1994 | Kadomura | 156/643 X |

Primary Examiner—Thi Dang
Attorney, Agent, or Firm—Robert A. Westerlund; Stephen R. Whitt; Charles R. Donohoe

[57] ABSTRACT

A method for forming a fine pattern, e.g., for forming the storage electrodes of the capacitors of the memory cells of semiconductor memory devices, which includes the steps of depositing a mask layer on the layer to be patterned, depositing a photoresist layer on the mask layer, patterning the photoresist layer, to thereby form a photoresist pattern, anisotropically etching the mask layer, using the photoresist pattern as an etching mask, to thereby form a mask layer pattern, wherein etch by-products are formed on sidewalls of a composite layer comprised of the photoresist pattern and the mask layer pattern, and, etching the layer to be patterned using the composite layer and the etch by-products as an etching mask, to thereby form a fine pattern. The mask layer is made of a material, e.g., a high-temperature oxide, having different physical properties than that of the photoresist. Further, the anisotropic etching process is preferably carried out by means of a plasma etching process using a mixture of $CF_4$, $CHF_4$, and Ar gases, with the amount of the etch by-products being controllably adjusted by the ratio of these gases, and/or by controllably adjusting the time, temperature, and/or pressure parameters of this anisotropic etching process.

7 Claims, 6 Drawing Sheets

5,476,807

METHOD FOR FORMING FINE PATTERNS IN A SEMICONDUCTOR DEVICE

BACKGROUND OF THE INVENTION

The present invention relates generally to a method for forming fine patterns in a semiconductor device, and more particularly, to a method for forming a very fine lined pattern in a semiconductor device, in which the minimum geometries are below the resolution limits of the photolithographic equipment employed to form the pattern.

The scale of integration of semiconductor devices has been progressively increasing at a rapid rate, thereby necessitating commensurate reduction of the geometries of the photolithographically-formed patterns which define the various device features (e.g., MOS transistor gates) thereof. Thus, increasingly sophisticated pattern definition technologies have been required as the critical geometries have shrunk from the 6 μm geometries of the 1970s to the submicron geometries of the 1980s to the deep submicron geometries of the 1990s. In this connection, the resolution limits of the optical wafer steppers employed in the photolithographic process has been advanced from 436 nm (g-line) to 365 nm (i-line), thereby enabling the formation of patterns with 0.4 μm minimum feature sizes.

FIG. 1 illustrates a conventional method for forming a pattern in a semiconductor device. More particularly, a photoresist layer 25 is deposited on a layer 22 to be patterned which is formed on a substrate 21. Then, a mask (not shown) having the desired pattern is used to selectively expose the photoresist layer 25, which is then developed, to thereby form a photoresist pattern 25. Then, the layer 22 is patterned using the photoresist pattern 25 as an etching mask.

FIGS. 2–6 illustrate successive steps of a method for forming a capacitor storage electrode of a semiconductor memory device, in which the conventional method of forming a fine lined pattern, using an i-line stepper, is employed.

With reference now to FIG. 2, there can be seen a semiconductor memory device which includes transistors each having a gate 3 and source/drain regions 4 formed in a semiconductor substrate 1 which is divided into isolation and active regions by field oxide layers 2, with the gates 3 of the transistors being insulated from the substrate 1 by an insulating layer 5 (e.g., gate oxide layer). An interlayer insulating layer 6 is formed on the entire surface of the resultant structure, and an insulating material, e.g., a nitride, is deposited on the interlayer insulating layer 6, thereby forming an etch-blocking layer 7. An insulating layer 8 is formed on the etch-blocking layer 7.

With reference now to FIG. 3, a photoresist layer 11 is deposited on the insulating layer 8, and then patterned by a photolithographic process, to thereby form a photoresist pattern 11. The, contact holes 9 extending through the layers 6, 7, and 8 to the source/drain regions 4 are formed by anisotropically etching the layers 6, 7, and 8, using the photoresist pattern 11 as an etching mask.

With reference now to FIG. 4, the photoresist pattern 11 is removed and a conductive material is then deposited on the entire surface of the resultant structure, including the surface portions defining the contact holes 9, to thereby form a conductive layer 10.

With reference now to FIG. 5, a photoresist layer 12 is deposited on the surface of the conductive layer 10, and then patterned by standard photolithographic techniques, in order to thereby form a photoresist pattern 12.

With reference now to FIG. 6, the conductive layer 10 is patterned by means of an anisotropic etching process, using the photoresist pattern 12 as an etching mask, in order to thereby form separate storage electrodes 10'. Thereafter, the insulating layer 8 is removed by means of a wet etching process. The resultant spacing A between the adjacent storage electrodes 10' is approximately 0.4 μm, when an i-line stepper is used in patterning the photoresist layer 12.

Thus, with the conventional method, even when the highest resolution stepper (an i-line stepper) is utilized, the minimum spacing A between adjacent features of the photoresist pattern used as an etching mask in forming a fine lined pattern in the semiconductor device, e.g., the storage electrodes of the capacitors of the memory cells of a dynamic random access memory (DRAM), is approximately 0.4 μm. This design rule constraint imposes an upper limit on the achievable density of the semiconductor memory device. Thus, in order to increase the cell packing density beyond that which is possible using the presently available fine pattern formation techniques, it is necessary to decrease the minimum spacing between adjacent surface features of the photoresist pattern used as an etching mask in forming such fine patterns beyond the resolution limits of presently available photolithographic equipment. The present invention fulfills this need.

SUMMARY OF THE INVENTION

The present invention encompasses a method for forming a fine pattern, e.g., for forming the storage electrodes of the capacitors of the memory cells of semiconductor memory devices, which includes the steps of depositing a mask layer on the layer to be patterned, depositing a photoresist layer on the mask layer, patterning the photoresist layer, to thereby form a photoresist pattern, anisotropically etching the mask layer, using the photoresist pattern as an etching mask, to thereby form a mask layer pattern, wherein etch by-products are formed on sidewalls of a composite layer comprised of the photoresist pattern and the mask layer pattern, and, etching the layer to be patterned using the composite layer and the etch by-products as an etching mask, to thereby form a fine pattern. The mask layer is made of a material, e.g., a high-temperature oxide, having different physical properties than that of the photoresist. Further, the anisotropic etching process is preferably carried out by means of a plasma etching process using a mixture of $CF_4$, $CHF_3$, and Ar gases, with the amount of the etch by-products being controllably adjusted by the ratio of these gases, and/or by controllably adjusting the time, temperature, and/or pressure parameters of this anisotropic etching process.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

The basic priniciples of the present invention will now be described in conjunction with FIG. 7, and various preferred embodiments of the present invention will be described hereinafter in conjuction with FIGS. 8–18.

Figure 1:
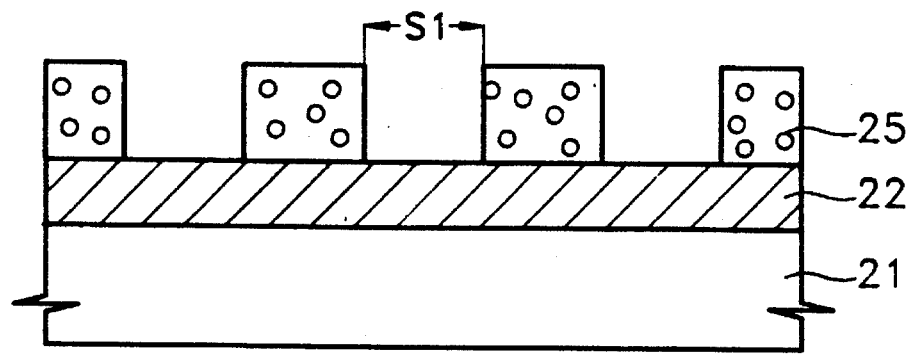
FIG. 1 is a cross-sectional view of a portion of a semiconductor device illustrating principles of a conventional method for forming a pattern utilizing a stepper.
Figure 2:
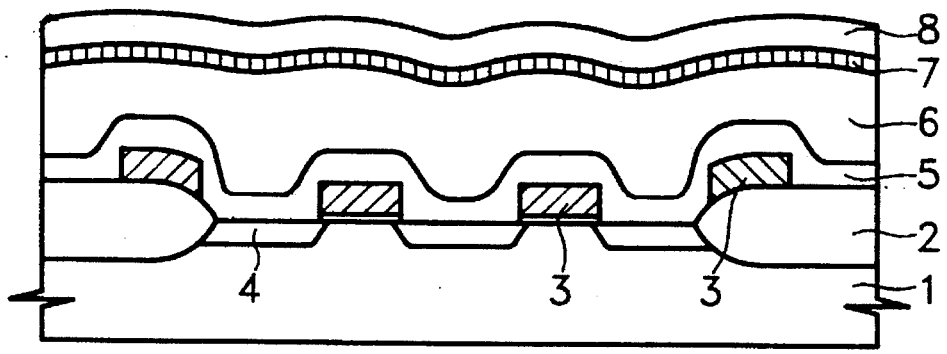
FIGS. 2–6 are cross-sectional views of a portion of a semiconductor device illustrating successive steps of a method for forming storage electrodes of capacitors of a semiconductor memory device, in which a conventional method for forming a fine pattern is employed.
Figure 3:
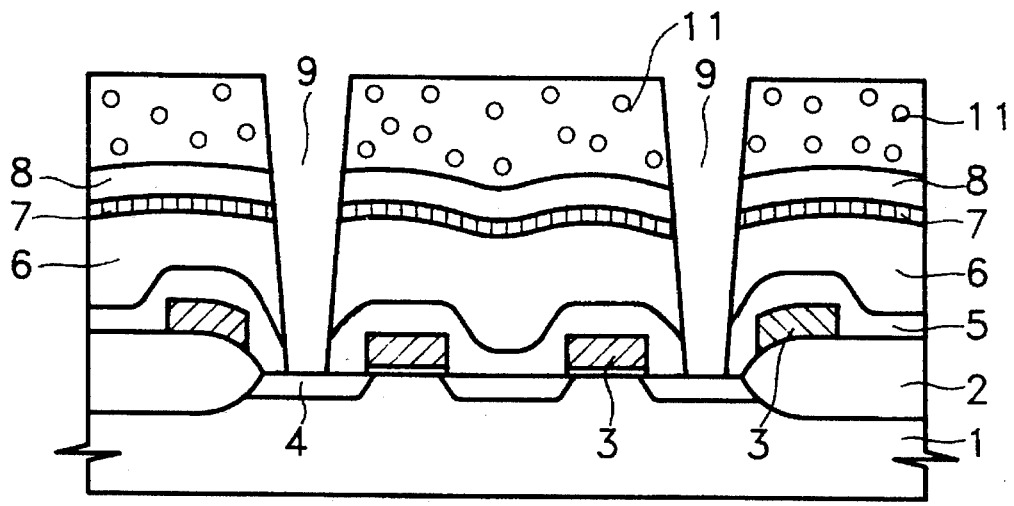
Figure 4:
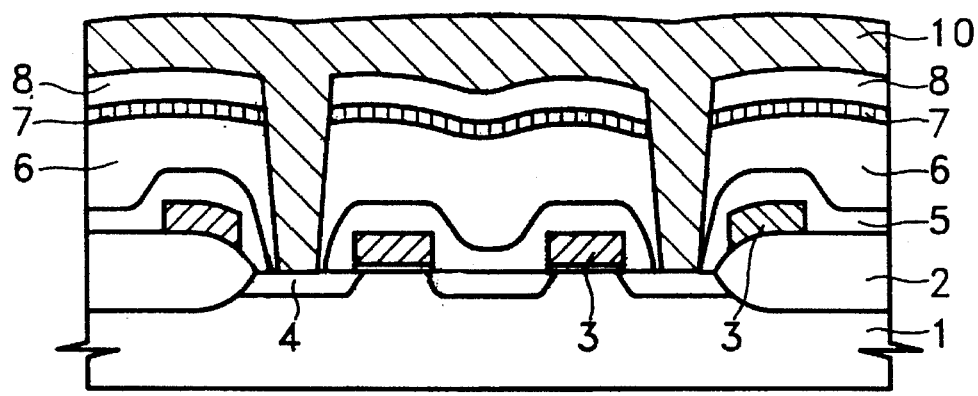
Figure 5:
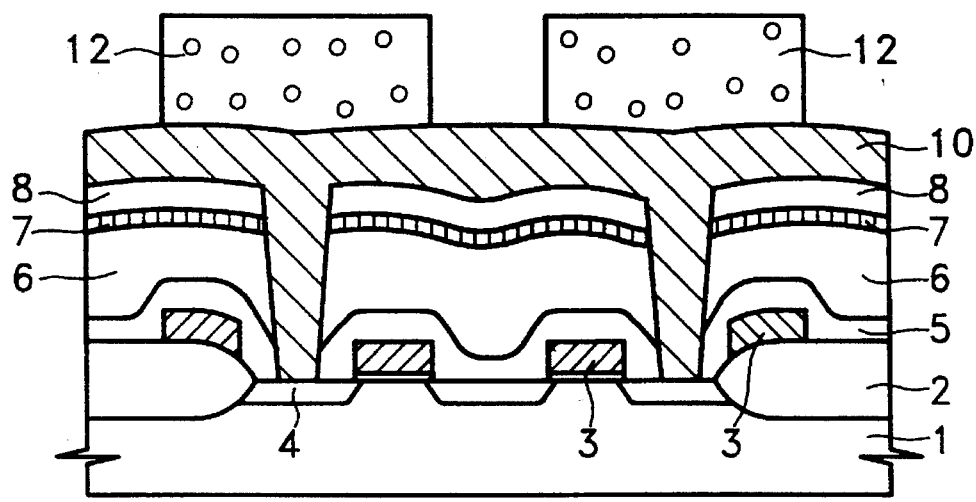
Figure 6:
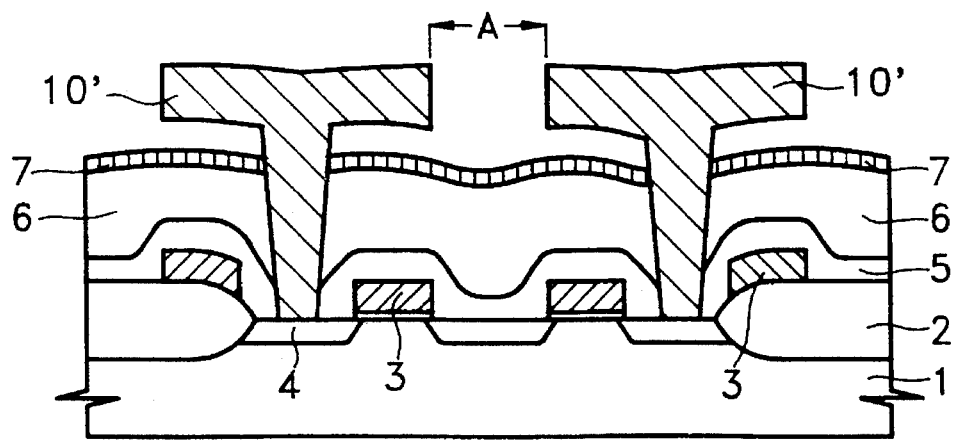
Figure 7:
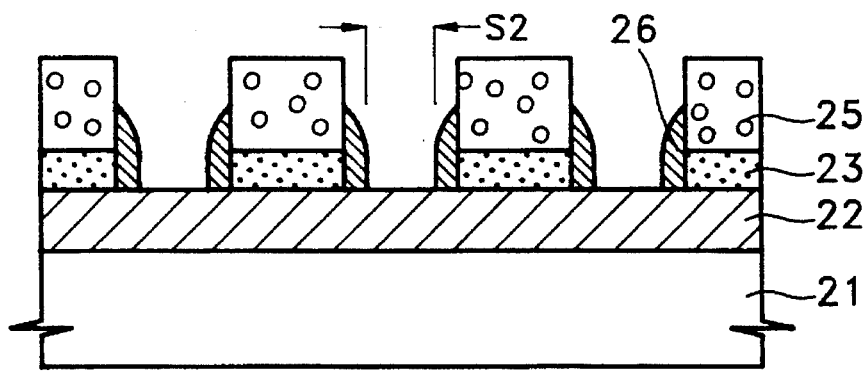
FIG. 7 is a cross-sectional view of a portion of a semiconductor device illustrating principles of the method of the present invention.

With reference now to FIG. 7, a mask layer 23 made of a material whose physical properties are different than that of photoresist is formed on a layer 22 to be patterned which is formed on a substrate 21. A photoresist layer 25 is deposited on the mask layer 23. Then, the photoresist is selectively exposed and developed by using a mask (not shown) having a desired pattern, to thereby form a photoresist pattern 25. Then, the mask layer 23 is patterned by means of an anisotropic etching process, using the photoresist pattern 25 as an etching mask, to thereby form a mask layer pattern 23. By virtue of employing the anisotropic etching process, a predetermined amount of etch by-products 26 are formed on the sidewalls of the mask layer pattern 23. Thereafter, the layer 22 to be patterned is etched by employing the etch by-products 26 together with the photoresist pattern 25 and the mask layer pattern 23 as an etching mask, to thereby form a fine resultant pattern (not shown).

When a pattern is formed in accordance with the above-described technique, etch by-products 26 formed on the sidewalls of the mask layer pattern 23 function as part of the etching mask. Thus, the spacing S2 between the adjacent features of the pattern is reduced by twice the width of the sidewall portions of the etch by-products 26. Thus, etch by-products produced by anisotropically etching a composite layer for forming a mask pattern become a part of the etch mask pattern, so that the resultant pattern formed by using the mask pattern will have minimum geometries below the resolution (exposure) limits of the stepper (not shown) that is utilized in the photolithographic process for forming the resultant pattern, wherein the composite layer is comprised of a photoresist layer and a mask layer made of a material having different physical properties than that of the photoresist.

FIGS. 8–11 are cross-sectional views illustrating successive steps of a method for forming a capacitor storage electrode of a semiconductor memory device, in which a method for forming a fine pattern in accordance with a first preferred embodiment of the present invention is utilized.

Figure 8:
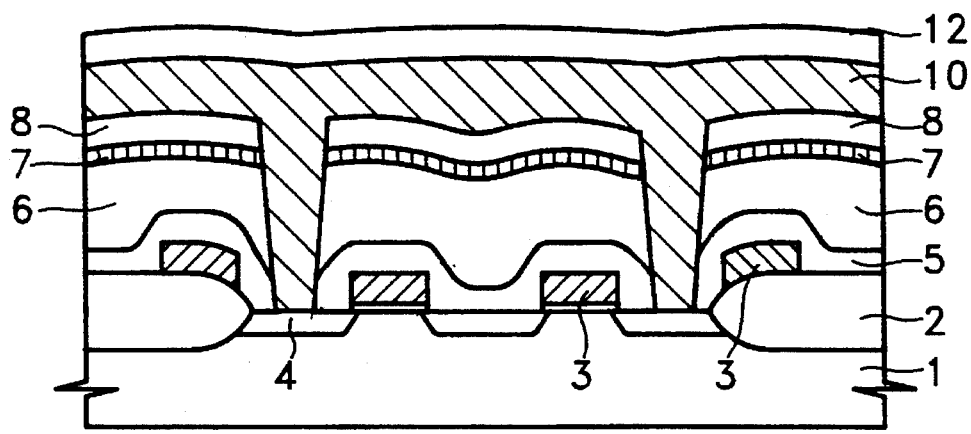
FIGS. 8–11 are cross-sectional views of a portion of a semiconductor device illustrating successive steps of a method for forming storage electrodes of capacitors of a semiconductor memory device, in which a method for forming a fine pattern in accordance with a first preferred embodiment of the present invention is utilized.

With reference now to FIG. 8, the steps of forming a transistor, conductive layer 10, and mask layer 12 will now be described. More particularly, transistors each having a gate 3 and source/drain regions 4 are formed on a semiconductor substrate 1 in any convenient manner well-known in the art. The semiconductor substrate 1 is divided into isolation and active regions by field oxide layers 2. An insulating layer 5 for insulating the transistors is formed on the entire surface of the resultant structure. An interlayer insulating layer 6 is formed on the entire surface of the resultant structure. An insulating material, e.g., nitride, is deposited on the interlayer insulating layer 6, to thereby form an etch-blocking layer 7. An insulating layer 8 is then deposited on the etch-blocking layer 7.

The portions of the insulating layer 8, the etch-blocking layer 7, and the interlayer insulating layer 6 disposed directly above the source/drain regions 4 of the transistors are selectively removed by means of a photolithographic process, to thereby form contact holes. Next, a conductive material, e.g., impurity-doped polysilicon, is deposited on the entire surface of the resultant structure, including the surface portions defining the contact holes, to thereby form a conductive layer 10. Thereafter, a mask layer 12 made of a material, e.g., a high-temperature oxide, whose physical properties are different from that of photoresist is formed on the conductive layer 10.

Figure 9:
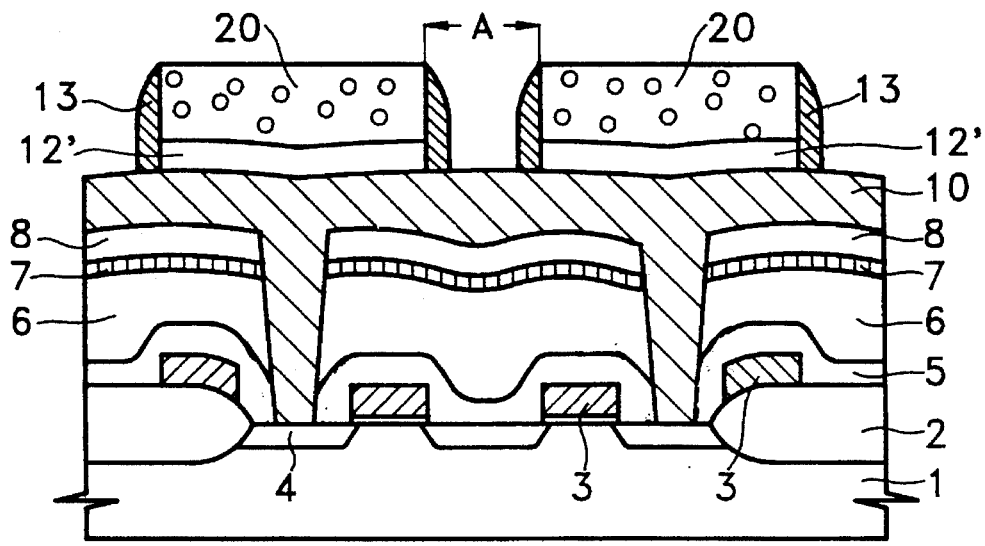

With reference now to FIG. 9, additional process steps embodying features of the present invention will now be described. More particularly, a photoresist material is deposited on the mask layer 12, and the photoresist material is patterned by means of a photolithographic process, to thereby form a photoresist pattern 20. If an i-line stepper is used in the photolithographic process, the minimum spacing A between adjacent surface features of the photoresist pattern 20 is approximately 0.4 µm, as in the prior art. Then, using the photoresist pattern 20 as an etching mask, the mask layer 12 is anisotropically etched by a plasma method which employs $CF_4$ and $CHF_3$ gases. As a result, a mask layer pattern 12' is formed, wherein polymer by-products (i.e., a residual polymer layer) are generated as a by-product of the anisotropic etching process, and thereby formed on the sidewalls of the photoresist pattern 20 and the mask layer pattern 12'.

Figure 10:
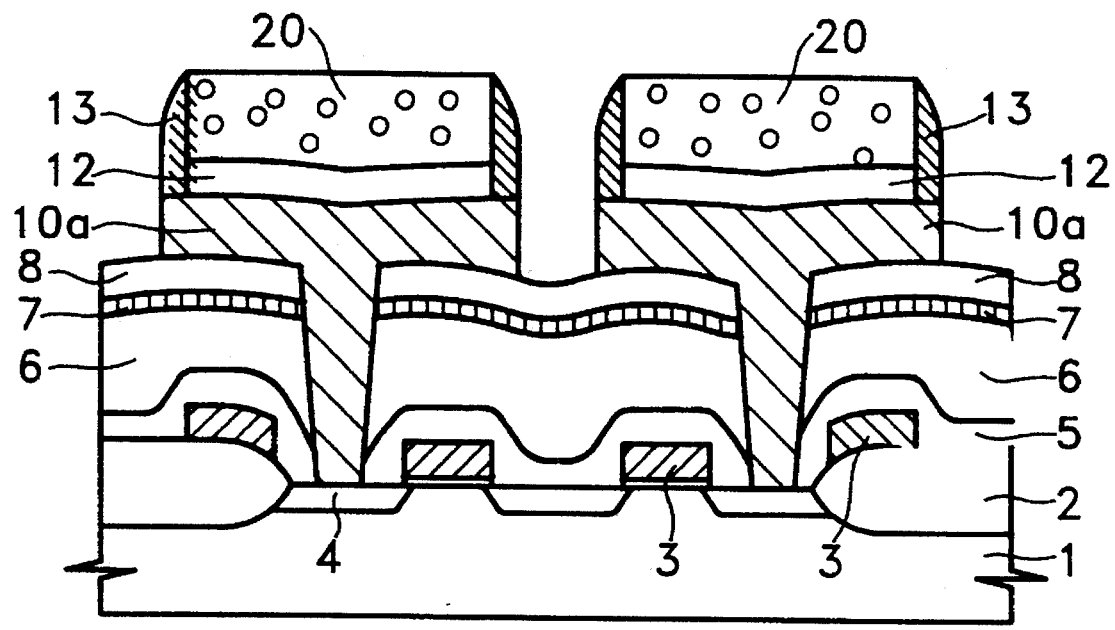
Figure 11:
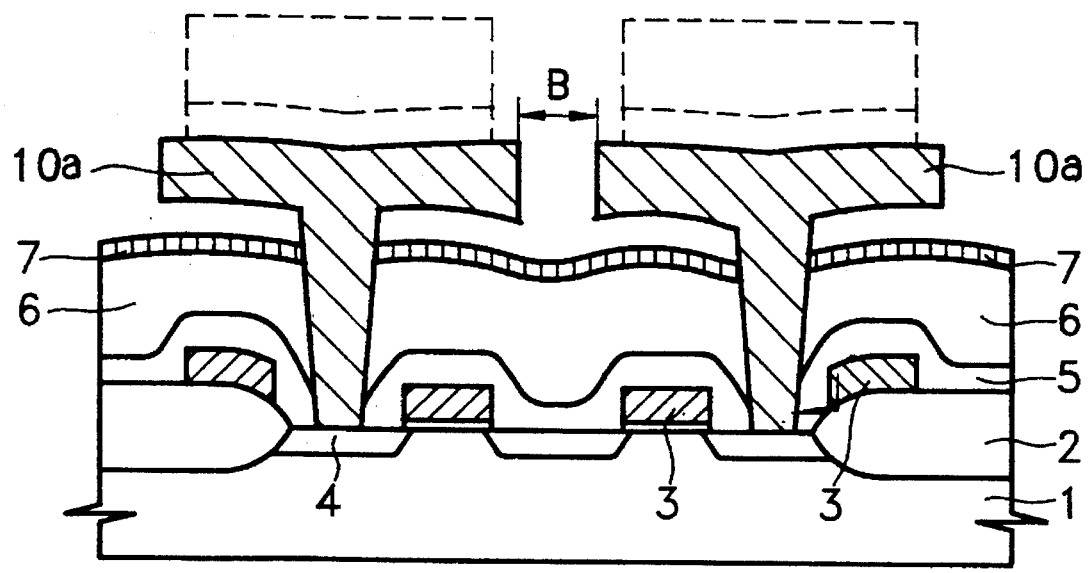

With reference now to FIGS. 10 and 11, the remaining steps for forming the storage electrodes of respective capacitors of the semiconductor memory device will now be described. More particularly, the conductive layer 10 is anisotropically etched using the photoresist pattern 20, the mask layer pattern 12', and the polymer by-products or residual polymer layer 13 as an etching mask, to thereby form the storage electrodes 10a. Though conventional methods routinely remove the polymer by-products 13 before etching, in accordance with the present invention, the etching operation is performed without removal of the polymer by-products 13. Then, the photoresist pattern 20 and the residual polymer layer 13 are removed. Finally, the interlayer insulating layer 8 below the storage electrodes 10a and the mask layer pattern 12' are removed by means of a wet etching process using ammonia ($NH_4$) and hydrofluoric acid (HF).

As can be seen in FIG. 11, since the conductive layer 10 is etched by employing the polymer by-products 13 as part of the etching mask, the spacing B between the storage electrodes 10a is smaller than the spacing A shown in FIG. 9. For example, when the anisotropic etching process is performed by a plasma etching method in which CF₄ and CHF₃ gases are used, with the mask layers being formed to a thickness of approximately 1,500 angstroms, a minimum spacing B between the storage electrodes 10a of approximately 0.2 µm can be easily obtained. Further, the amount of the polymer by-products 13 generated by the etching process can be controllably adjusted by means of controlling the thickness of the mask layer, to thereby achieve minimum spacings of even less than 0.2 µm. Accordingly, with the method of the first preferred embodiment of the present invention it is possible to achieve a spacing between adjacent surface features of a fine pattern below the resolution limits of the stepper used in the photolithographic process for forming the etching mask utilized in forming the fine pattern. Additionally, when the method of the first preferred embodiment of the present invention is applied to forming the capacitors of the memory cells of a 16M DRAM, a capacitance increase of at least 7 fF can be obtained relative to the conventional process described hereinbefore.

Figure 12:
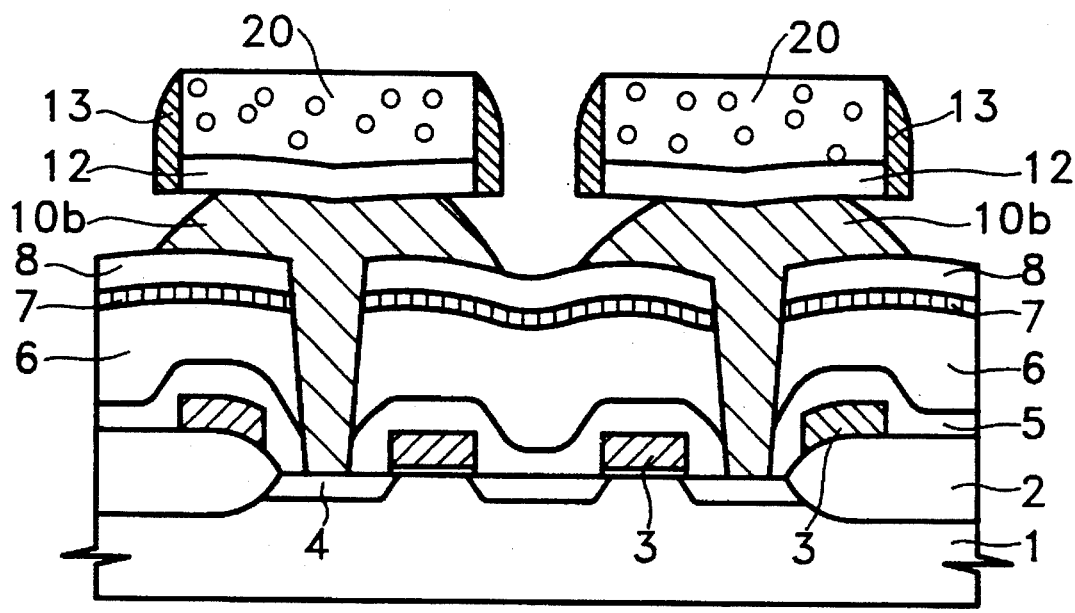
FIGS. 12 and 13 are cross-sectional views of a portion of a semiconductor device illustrating successive steps of a method for forming storage electrodes of capacitors of a semiconductor memory device, in which a method for forming a fine pattern in accordance with a second preferred embodiment of the present invention is utilized; and, FIGS. 14–16 are cross-sectional views of a portion of a semiconductor memory device illustrating successive steps of a method for forming storage electrodes of capacitors of a semiconductor memory device, in which a method for forming a fine pattern in accordance with a third preferred embodiment of the present invention is utilized.
Figure 13:
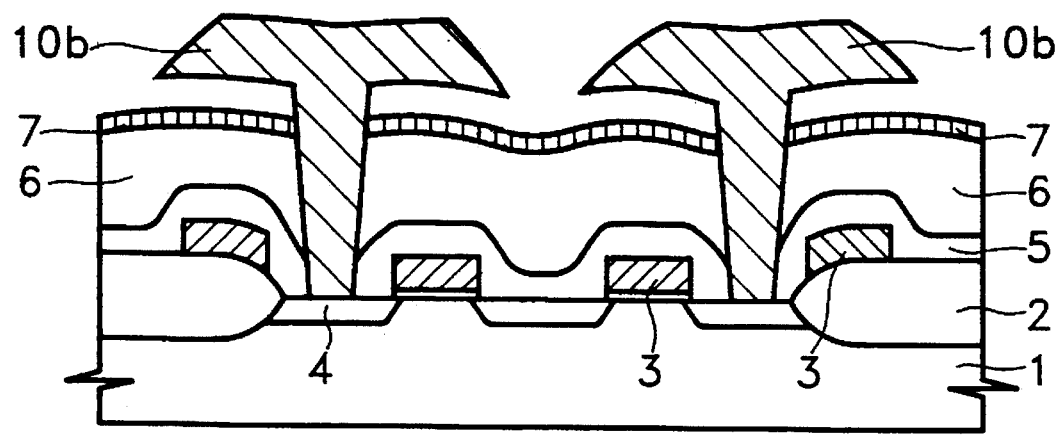
Figure 14:
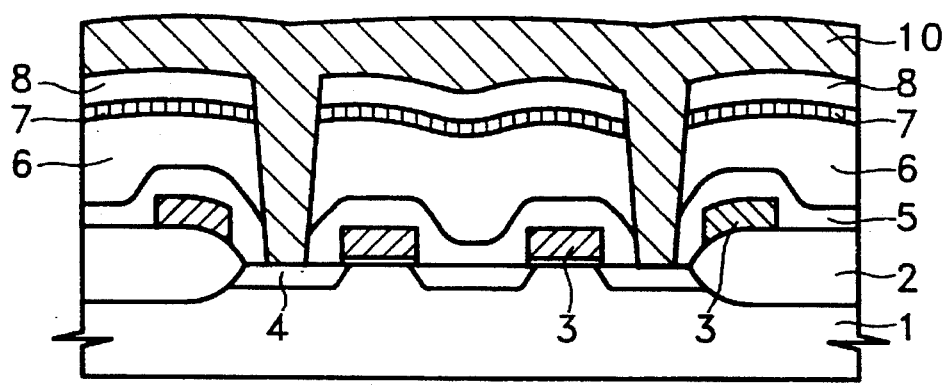
Figure 15:
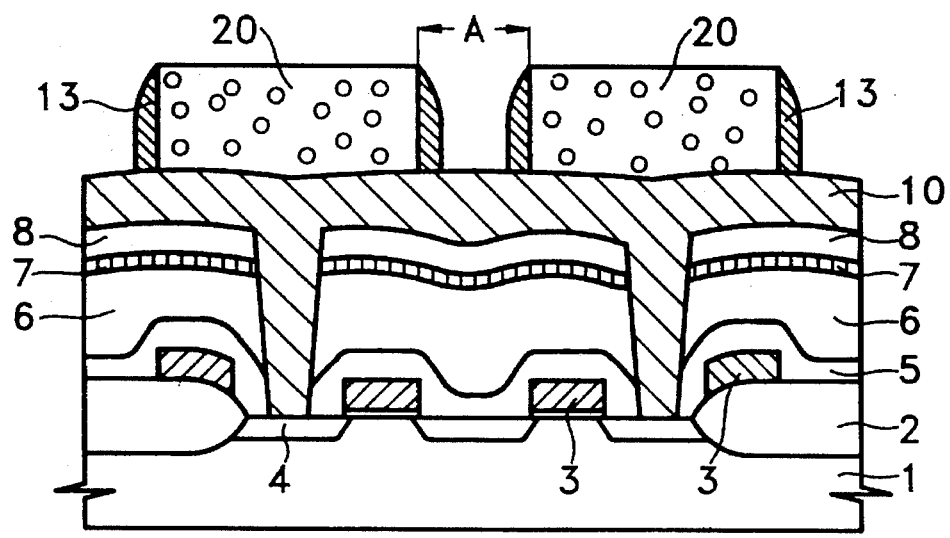

FIGS. 12–13 are cross-sectional views illustrating successive steps of a method for forming a capacitor storage electrode of a semiconductor memory device, in which a method for forming a fine pattern in accordance with a second preferred embodiment of the present invention is utilized.

With reference now to FIG. 12, it can be seen that a residual polymer layer 13 is formed in the same manner as with the previously described first preferred embodiment of the present invention. In accordance with the second preferred embodiment of the present invention, the conductive layer 10 is slope-etched using the photoresist pattern 20, the mask layer pattern 12', and the residual polymer layer 13 as an etching mask, to thereby form storage electrodes 10b having sloped or rounded corners or edges, as opposed to sharp corners or edges. The sloped etching is performed by means of an isotropic etching process.

With reference now to FIG. 13, after the photoresist pattern 20 and the residual polymer layer 13 are removed, the interlayer insulating layer 8 below the storage electrodes 10b and the mask layer pattern 12' are removed by a wet etching process using ammonia and hydrofluoric acid.

Figure 16:
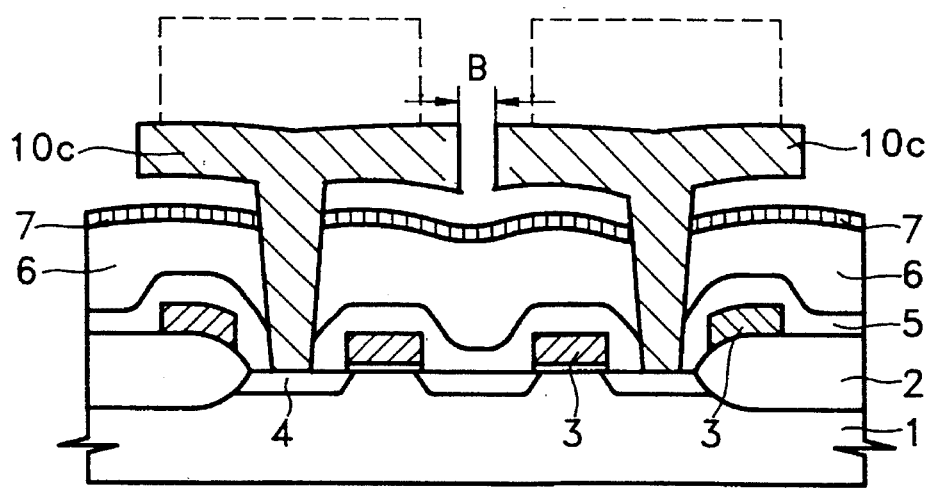

FIGS. 16–18 are cross-sectional views illustrating successive steps of a method for forming a capacitor storage electrode of a semiconductor memory device, in which a method for forming a fine pattern in accordance with a third preferred embodiment of the present invention is utilized.

FIG. 16 depicts the same structure as that depicted in FIG. 8 in connection with the first preferred embodiment of the present invention, with the exception of the mask layer 12.

FIG. 17 depicts the steps of forming the photoresist pattern 20 and the residual polymer layer 13. More particularly, a photoresist layer 20 is deposited on the conductive layer 10, and then patterned by means of a photolithographic process, to thereby form the photoresist pattern 20. If the photolithographic process is performed by employing an i-line stepper, the minimum spacing A between adjacent features of the photoresist pattern 20 is 0.4 µm, as in the prior art. Next, a polymer layer (not shown) is formed on the photoresist pattern 20, and the polymer layer is then selectively etched by an anisotropic etching process performed by a plasma method where CF₄, CHF₃, and argon (Ar) gases are used, whereby a residual polymer layer 13, which is a by-product of the anisotropic etching process, is formed on the sidewalls of the photoresist pattern 20. The amount of the polymer by-products can be controllably adjusted by varying the ratio of the three gases used, and specifically, more polymer by-products are generated when the mole ratio of the CHF₃ gas is increased. In addition, the temperature employed in the anisotropic etching process, i.e., the temperature of the lower electrode (not shown) of the etching chamber (not shown), is preferably relatively low, e.g., in the range of between −15° C. to +15° C. In general, the amount of the polymer by-products can be increased by decreasing the temperature. Moreover, the pressure within the etching chamber can to increased in order to thereby easily increase the amount of polymer by-products which are generated.

With reference now to FIG. 18, the conductive layer 10 is anisotropically etched using the photoresist pattern 20 and the residual polymer layer 13 as an etching mask, to thereby form storage electrodes 10c. Then, the photoresist pattern 20 and the residual polymer layer 13 are removed. Next, the interlayer insulating layer 8 below the storage electrodes 10c is removed by a wet etching process using ammonia and hydrofluoric acid. The resultant spacing B between the storage electrodes 10c is less than the spacing A depicted in FIG. 17. As will be appreciated by those skilled in the art, with the above-described method of the third preferred embodiment of the present invention, the pattern for forming the storage electrodes is formed as a single photoresist layer instead of as a composite layer, thereby shortening the amount of time required for performing the process. The reduction in the spacing between adjacent storage electrodes is instead achieved by means of controlling the amount of the polymer by-products generated by the anisotropic etching process by means of adjusting one or more of the parameters of this process, e.g., the ratio of the gases, the temperature and/or pressure of the etching chamber, and/or the etching time. With this method, a spacing of 0.2 µm or less between adjacent storage electrodes can also be achieved. In addition, as in the second preferred embodiment of the present invention, a slope-etching process can be employed to perform a sloped etching of the conductive layer 10.

Based on the above and foregoing, it can now be appreciated by those skilled in the art that with the method for forming a fine pattern in accordance with the above-described preferred embodiments of the present invention, a fine pattern having minimum geometries below the resolution of presently available steppers can be produced, thereby facilitating the manufacture of semiconductor devices of increased integration density, e.g., higher-density semiconductor memory devices, relative to that which is possible with the presently available methods for forming fine patterns in a semiconductor device, without increasing the cost or complexity of the manufacturing process.

Although various preferred embodiments of the present invention have been described in detail hereinabove, it should be clearly understood that many variations and/or modifications of the basic inventive concepts herein taught which may appear to those skilled in the pertinent art will still fall within the spirit and scope of the present invention as defined in the appended claims.

What is claimed is:

1. A method for manufacturing a semiconductor memory device, comprising the steps of:

providing a semiconductor substrate in which a transistor having a gate and source/drain regions is formed;

forming a first insulating layer on said semiconductor substrate;

forming an interlayer insulating layer on said first insulating layer;

forming an etch-blocking layer on said interlayer insulating layer;

forming a second insulating layer on said etch-blocking layer;

selectively etching said first insulating layer, said interlayer insulating layer, said etch-blocking layer, and said second insulating layer, to thereby form contact holes to expose said source/drain regions;

forming a conductive layer on the surface of the resultant structure, including surface portions defining said contact holes;

depositing a mask layer on said conductive layer;

depositing a photoresist layer on said mask layer;

patterning said photoresist layer in accordance with a capacitor storage electrode pattern, to thereby form a photoresist pattern;

anisotropically etching said mask layer, using said photoresist pattern as an etching mask, to thereby form a mask layer pattern, wherein etch by-products are formed on sidewalls of a composite layer comprised of said photoresist pattern and said mask layer pattern; and, etching said conductive layer using said composite layer and said etch by-products as an etching mask, to thereby form a fine pattern.

2. The method as set forth in claim 1, further comprising the step of removing said composite layer and said etch by-products.

3. The method as set forth in claim 2, wherein said etch by-products together comprise a residual polymer layer.

4. A method for forming a fine pattern, comprising the steps of:

depositing a mask layer on said layer to be patterned;

depositing a photoresist layer on said mask layer;

patterning said photoresist layer, to thereby form a photoresist pattern;

anisotropically etching said mask layer, using said photoresist pattern as an etching mask, to thereby form a mask layer pattern, wherein etch by-products are formed on sidewalls of a composite layer comprised of said photoresist pattern and said mask layer pattern; and, etching said layer to be patterned using said composite layer and said etch by-products as an etching mask, to thereby form a fine pattern.

5. The method as set forth in claim 4, wherein said mask layer is made of a material having different physical properties than that of said photoresist layer.

6. The method as set forth in claim 5, wherein said mask layer is made of a high-temperature oxide material.

7. The method as set forth in claim 6, wherein the amount of said etch by-products is controllably adjusted by means of varying one or more parameters of said anisotropically etching process.

* * * * *